(12) United States Patent
Chen et al.

(10) Patent No.: US 12,400,876 B2
(45) Date of Patent: Aug. 26, 2025

(54) METHODS OF MANUFACTURE HAVING REDISTRIBUTION LAYER USING DIELECTRIC MATERIAL PHOTOACTIVE COMPONENT

(71) Applicant: Taiwan Semiconductor Manufacturing Co., Ltd., Hsinchu (TW)

(72) Inventors: Wei-Chih Chen, Taipei (TW); Yu-Hsiang Hu, Hsinchu (TW); Hung-Jui Kuo, Hsinchu (TW); Sih-Hao Liao, New Taipei (TW)

(73) Assignee: Taiwan Semiconductor Manufacturing Co, Ltd., Hsinchu (TW)

( * ) Notice: Subject to any disclaimer, the term of this patent is extended or adjusted under 35 U.S.C. 154(b) by 0 days.

(21) Appl. No.: 18/447,389

(22) Filed: Aug. 10, 2023

(65) Prior Publication Data

US 2023/0386861 A1   Nov. 30, 2023

Related U.S. Application Data

(62) Division of application No. 17/245,856, filed on Apr. 30, 2021, now Pat. No. 12,119,235.

(60) Provisional application No. 63/109,474, filed on Nov. 4, 2020.

(51) Int. Cl.
| | |
|---|---|
| *H01L 21/48* | (2006.01) |
| *G03F 7/00* | (2006.01) |
| *H01L 23/498* | (2006.01) |
| *H01L 23/00* | (2006.01) |
| *H10F 39/00* | (2025.01) |

(52) U.S. Cl.
CPC ............ *H01L 21/4857* (2013.01); *G03F 7/70* (2013.01); *H01L 21/481* (2013.01); *H01L 23/49822* (2013.01); *H01L 23/49838* (2013.01); *H01L 23/49894* (2013.01); *H01L 24/24* (2013.01); *H01L 24/25* (2013.01); *H01L 2224/24147* (2013.01); *H01L 2224/24227* (2013.01); *H01L 2224/25171* (2013.01); *H01L 2224/2518* (2013.01); *H01L 2924/14335* (2013.01); *H01L 2924/1461* (2013.01); *H10F 39/809* (2025.01)

(58) Field of Classification Search
CPC ...... H01L 21/4857; H01L 21/481; G03F 7/70
See application file for complete search history.

(56) References Cited

U.S. PATENT DOCUMENTS

| | | |
|---|---|---|
| 8,324,699 B2 | 12/2012 | Ichijo et al. |
| 8,361,842 B2 | 1/2013 | Yu et al. |
| 8,680,647 B2 | 3/2014 | Yu et al. |

(Continued)

FOREIGN PATENT DOCUMENTS

| | | |
|---|---|---|
| DE | 102016115788 A1 | 4/2017 |
| DE | 102018125161 B3 | 7/2019 |
| KR | 20170046073 A | 4/2017 |

*Primary Examiner* — Michael Jung
(74) *Attorney, Agent, or Firm* — Slater Matsil, LLP

(57) ABSTRACT

A passivation layer and conductive via are provided, wherein the transmittance of an imaging energy is increased within the material of the passivation layer. The increase in transmittance allows for a greater cross-linking that helps to increase control over the contours of openings formed within the passivation layer. Once the openings are formed, the conductive vias can be formed within the openings.

20 Claims, 15 Drawing Sheets

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 10,304,700 B2 | 5/2019 | Liu et al. |
| 2007/0037406 A1 | 2/2007 | Park et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0117380 A1 | 5/2014 | Loboda et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0306250 A1 | 10/2014 | Gardner et al. |
| 2015/0061127 A1 | 3/2015 | Chen et al. |
| 2016/0147145 A1 | 5/2016 | Ng et al. |
| 2016/0312797 A1 | 10/2016 | Suciu et al. |
| 2017/0271203 A1 | 9/2017 | Liu et al. |
| 2017/0271501 A1 | 9/2017 | Avci et al. |
| 2018/0061669 A1 | 3/2018 | Liao et al. |
| 2018/0083435 A1 | 3/2018 | Redler |
| 2020/0006086 A1 | 1/2020 | Kuo et al. |
| 2020/0273773 A1 | 8/2020 | Wan et al. |
| 2020/0303316 A1 | 9/2020 | Chang et al. |
| 2021/0118788 A1* | 4/2021 | Lee .................. H01L 24/20 |
| 2021/0257305 A1* | 8/2021 | Yim .................. H01L 23/49811 |
| 2022/0077041 A1* | 3/2022 | Jeon .................. H01L 21/4857 |
| 2022/0077077 A1 | 3/2022 | Kim et al. |

* cited by examiner

METHODS OF MANUFACTURE HAVING REDISTRIBUTION LAYER USING DIELECTRIC MATERIAL PHOTOACTIVE COMPONENT

PRIORITY CLAIM AND CROSS-REFERENCE

This application is a divisional of U.S. patent application Ser. No. 17/245,856, filed on Apr. 30, 2021, entitled "Methods of Manufacture of Semiconductor Devices Having Redistribution Layer Using Dielectric Material Having Photoactive Component," which claims the benefit of U.S. Provisional Application No. 63/109,474, filed on Nov. 4, 2020, which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
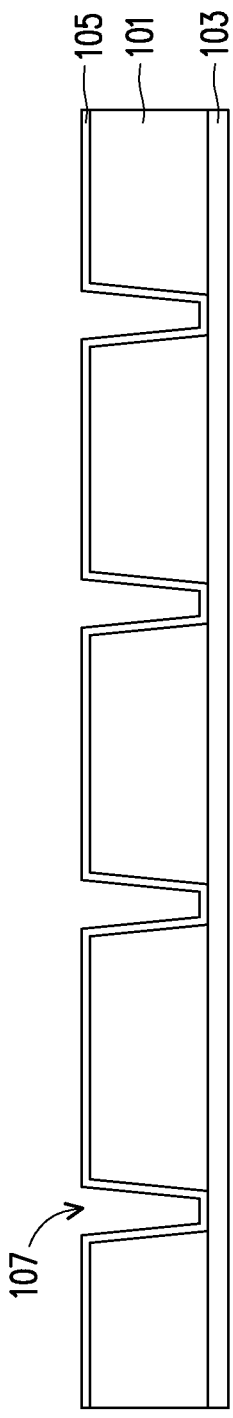
FIG. 1 illustrates a carrier, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular structures and materials, such as integrated fan out packages. The embodiments described herein, however, may be used in a wide variety of embodiments, and all such embodiments are fully intended to be included within the scope of the embodiments.

With reference now to FIG. 1, there is illustrated a carrier 101, a film tape 103 located on a first side of the carrier 101, and a first seed layer 105 that has been formed on the carrier 101. In an embodiment the carrier may comprise a material such as aluminum nitride (AlN), silicon oxide, silicon, aluminum oxide, combinations of these, or the like. Additionally, the carrier 101 is shaped in order to accommodate formation of overlying layers. However, any suitable materials and shapes may be utilized.

Additionally, the carrier 101 comprises first openings 107 through the carrier 101. The first openings 107 are placed in order to help form conductive vias 203 (not illustrated in FIG. 1 but illustrated and discussed further below with respect to FIG. 2). In an embodiment the first openings 107 may be formed using a photolithographic masking and etching process. However, any suitable process may be utilized.

The film tape 103 is placed and located along a first side of the carrier 101. In an embodiment the film tape 103 may be an ultraviolet tape which loses its adhesive properties when exposed to ultra-violet light. However, other types of tapes, such as pressure sensitive tapes, radiation curable tapes, combinations of these, or the like, may also be used. Any suitable film tape 103 may be utilized.

The first seed layer 105 is formed over the carrier 101 and within the first openings 107. In an embodiment the first seed layer 105 is a thin layer of a conductive material that aids in the formation of a thicker layer during subsequent processing steps. The first seed layer 105 may comprise a layer of titanium about 1,000 Å thick followed by a layer of copper about 5,000 Å thick. The first seed layer 105 may be created using processes such as sputtering, evaporation, or PECVD processes, depending upon the desired materials. The first seed layer 105 may be formed to have a thickness of between about 0.3 µm and about 1 µm, such as about 0.5 µm.

Figure 2:
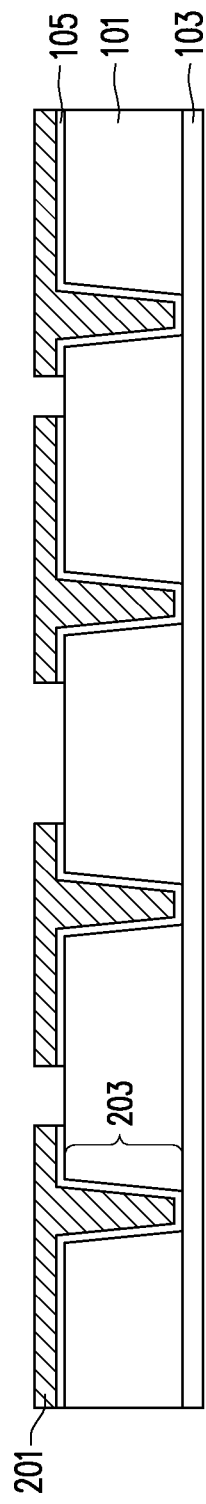
FIG. 2 illustrates formation of a redistribution layer, in accordance with some embodiments.

FIG. 2 illustrates formation of a first redistribution layer 201 and through vias 203 on and through the carrier 101. In an embodiment the first redistribution layer 201 and the through vias 203 are formed by initially forming a photoresist (not separately illustrated in FIG. 2) onto the first seed layer 105. In an embodiment the photoresist may be placed on the first seed layer 105 using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the through vias 203 and the first redistribution layer 201. Once the photoresist is in place, the through vias 203 and the first redistribution layer 201 are formed within the photoresist. In an embodiment the through vias 203 and the first redistribution layer 201 comprise one or more conductive materials, such as copper, tungsten, other conductive metals, or the like, and may be formed, for example, by electroplating, electroless plating, or the like. In an embodiment, an electroplating process is used wherein the first seed layer 105 and the photoresist are submerged or immersed in an electroplating solution. The first seed layer 105 surface is electrically connected to the negative side of an external DC power supply such that the first seed layer 105 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 105, acquires the dissolved atoms, thereby plating the exposed conductive areas of the first seed layer 105 within the opening of the photoresist.

Once the through vias 203 and the first redistribution layer 201 have been formed using the photoresist and the first seed layer 105, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the first seed layer 105.

Once exposed a removal of the exposed portions of the first seed layer 105 may be performed. In an embodiment the exposed portions of the first seed layer 105 (e.g., those portions that are not covered by the through vias 203 and the first redistribution layer 201) may be removed by, for example, a wet or dry etching process. For example, in a dry etching process reactants may be directed towards the first seed layer 105 using the through vias 203 and the first redistribution layer 201 as masks. In another embodiment, etchants may be sprayed or otherwise put into contact with the first seed layer 105 in order to remove the exposed portions of the first seed layer 105. After the exposed portion of the first seed layer 105 has been etched away, a portion of the carrier 101 is exposed between the through vias 203 and the first redistribution layer 201.

In an embodiment the first redistribution layer 201 (with or without the first seed layer 105) may be formed to have a thickness of greater than about 20 µm, such as between about 20 µm and about 70 µm. By utilizing a thickness this large, transmittance losses may be reduced, which also leads to an increased power efficiency. However, any suitable thickness may be utilized.

Figure 3:
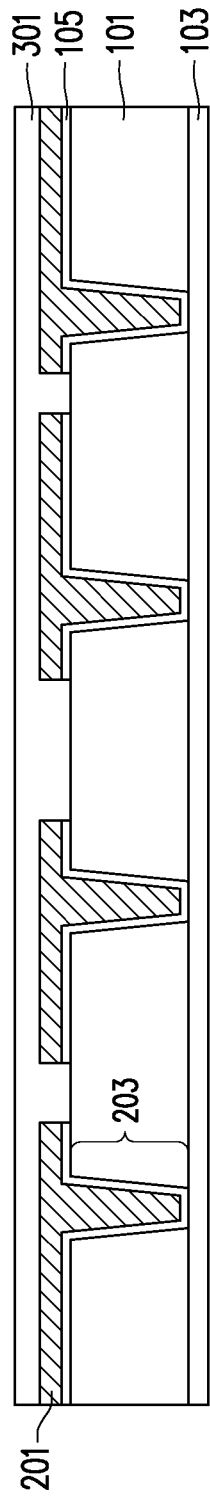
FIG. 3 illustrates formation of a first passivation layer, in accordance with some embodiments.

FIG. 3 illustrates a placement of a first passivation layer 301 over the first redistribution layer 201. In an embodiment the first passivation layer 301 comprises a material which will not significantly shrink during subsequent processes and which will also have a high transmittance during subsequent exposure processes (e.g., photolithographic exposures). For example, in some embodiments the first passivation layer 301 may be a material such as polyimide, a polybenzoxazole (PBO), an epoxy, bismaleimide triazine (BT), poly(p-phenylene oxide), combinations of these, or the like. However, any suitable material may be used.

In an embodiment in which the first passivation layer 301 is a polyimide material, the first passivation layer 301 may be formed by initially generating a polyimide composition, which may comprise a polyimide resin along with photoactive components (PACs) placed into a polyimide solvent. In an embodiment the polyimide resin may comprise a polymer that is made up of monomers of the following formula:

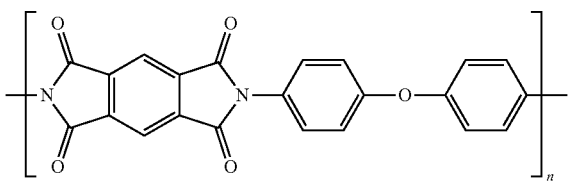

Additionally, while the polyimide resin may be the embodiment as described above, the polyimide resin is not intended to be limited to only the specific example described herein. Rather, any suitable polyimide resin may be utilized, and all such photosensitive polyimide resins are fully intended to be included within the scope of the embodiments.

The PACs may be photoactive components such as photoacid generators, photobase generators, free-radical generators, or the like, and the PACs may be positive-acting or negative-acting. In an embodiment the PACs may comprise a first PAC mixture of one or more compounds, such as a first PAC compound, a second PAC compound, a third PAC compound, and a fourth PAC compound. However, any suitable number of PAC compounds may be utilized.

In an embodiment the first PAC compound can comprise a multi-ring compound with a phosphine group. In some embodiments the multi-ring compound comprises three or more carbon rings, wherein the one or more carbon rings are connected to each other through the phosphine group. In a particular embodiment the first PAC compound comprises the following structure:

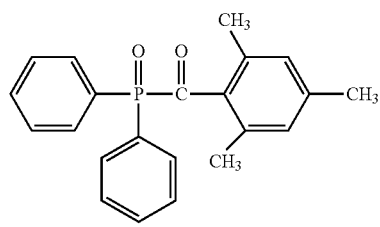 [SMILES: Cc1cc(C)c(C(=O)P(=O)(c2ccccc2)c2ccccc2)c(C)c1]

However, any suitable structure may be utilized.

In an embodiment the second PAC compound can comprise another multi-ring compound with a phosphine group. In some embodiments the another multi-ring compound comprises three or more carbon rings, wherein the one or more carbon rings are connected to each other with the phosphine group in a structure different from the first PAC compound. In a particular embodiment the second PAC compound comprises the following structure:

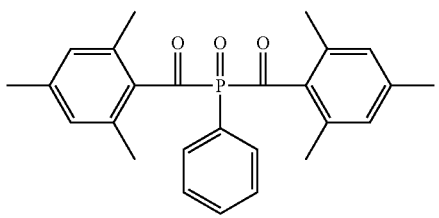

However, any suitable structure may be utilized.

In an embodiment the third PAC compound can comprise another multi-ring compound, but without the phosphine group. Rather, in an embodiment the third PAC compound comprises three or more carbon rings which are directly connected to each other without a phosphine group. In some embodiments the third PAC compound comprises three or more carbon rings, wherein the one or more carbon rings are connected to each other without the phosphine group in a structure different from the first PAC compound. In a particular embodiment the third PAC compound comprises the following structure:

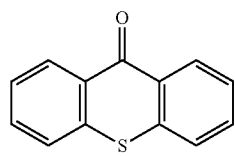 [SMILES: O=c1c2ccccc2sc2ccccc12]

However, any suitable structure may be utilized.

In an embodiment the fourth PAC compound can comprise another ring structure, but in this embodiment the number of rings is less than 3, such as having a single carbon ring. Additionally, the fourth PAC compound can comprise an amine group connected to the carbon ring. As such, in an embodiment the fourth PAC compound comprises the following structure:

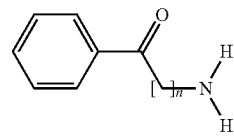

Wherein n is between 1 and 1000. However, any suitable structure may be utilized.

In an embodiment the first PAC compound, the second PAC compound, the third PAC compound, and the fourth PAC compound collectively form the first PAC mixture. For example, within the first PAC mixture, the first PAC compound may have a concentration of between about 0.03 wt % and about 1.0 wt %, the second PAC compound may have a concentration of between about 0.03 wt % and about 1.0 wt %, the third PAC compound may have a concentration of between about 0.03 wt % and about 1.0 wt %, and the fourth PAC compound may have a concentration of between about 0.03 wt % and about 1.0 wt %. However, any suitable concentrations may be utilized.

By utilizing the materials presented herein for the first PAC mixture, the overall transmittance of the first passivation layer 301 can be increased. By increasing the transmittance, subsequent imaging (described further below with respect to FIG. 4A) allows for greater cross-linking to occur deeper within the first passivation layer 301. Such a cross-linking allows for a better chemical resistance during development, thereby allowing via holes with more controlled angles to be achieved.

In another embodiment, instead of using the composition of materials as described above for the first PAC mixture, a second PAC mixture may be used which allows for a reduction in the overall concentrations of PACs within the first passivation layer 301. In this embodiment, the second PAC mixture may comprise a fifth PAC compound, a sixth PAC compound, a seventh PAC compound, an eighth PAC compound, a ninth PAC compound, and a tenth PAC compound. In this embodiment one or more of the fifth PAC compound, the sixth PAC compound, the seventh PAC compound, the eighth PAC compound, the ninth PAC compound, and the tenth PAC compound comprise carbon rings with a ring number less than or equal to 2 (including saturated and unsaturated rings).

For example, in an embodiment the fifth PAC compound can comprise a ring structure, and in this embodiment the number of rings is less than or equal to 2, such as having two carbon rings. As such, in an embodiment the fifth PAC compound comprises the following structure:

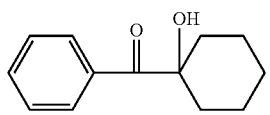 [SMILES: O=C(c1ccccc1)C1(O)CCCCC1]

However, any suitable structure may be utilized.

Additionally, in an embodiment the sixth PAC compound can also comprise a ring structure, and in this embodiment the number of rings is less than or equal to 2, such as having two carbon rings. As such, in an embodiment the sixth PAC compound comprises the following structure:

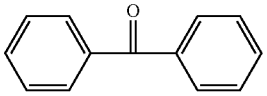 [SMILES: O=C(c1ccccc1)c1ccccc1]

However, any suitable structure may be utilized.

In an embodiment the seventh PAC compound can comprise yet another ring structure, where the number of rings is less than or equal to 2, such as having two carbon rings. Additionally in this embodiment, the rings are connected through a structure comprising methoxy groups. For example, in an embodiment the seventh PAC compound comprises the following structure:

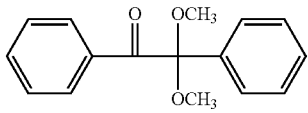

However, any suitable structure may be utilized.

In an embodiment the eighth PAC compound can comprise a ring structure, but in this embodiment the number of rings is less than or equal to 2, such as having one carbon ring. As such, in an embodiment the eighth PAC compound comprises the following structure:

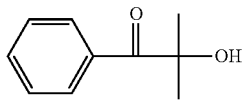

However, any suitable structure may be utilized.

In an embodiment the ninth PAC compound can comprise a ring structure, but in this embodiment the number of rings is equal to or greater than 3, such as having three carbon rings. As such, in an embodiment the ninth PAC compound comprises the following structure:

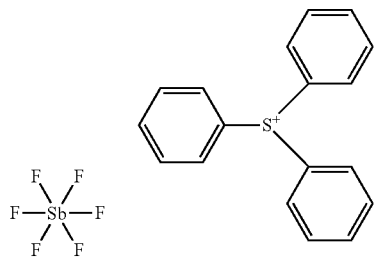

However, any suitable structure may be utilized.

Finally, in an embodiment the tenth PAC compound can comprise the following structure:

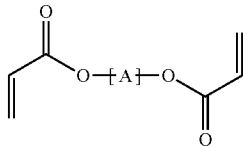

Wherein A comprises —$(CH_2)_n$—, wherein n is between 1 and 1000, and may have the following structures:

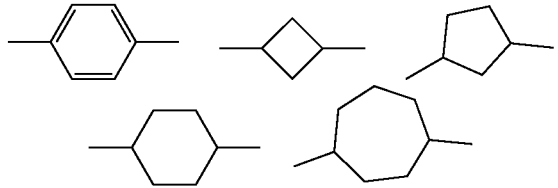

However, any suitable structure may be utilized.

In an embodiment the fifth PAC compound, the sixth PAC compound, the seventh PAC compound, the eighth PAC compound, the ninth PAC compound, and the tenth PAC compound collectively form the second PAC mixture. For example, within the second PAC mixture the fifth PAC compound may have a concentration of between about 0.03 wt % and about 1 wt %, the sixth PAC compound may have a concentration of between about 0.03 wt % and about 1 wt %, the seventh PAC compound may have a concentration of between about 0.03 wt % and about 1 wt %, and the eighth PAC compound may have a concentration of between about 0.03 wt % and about 1 wt %, the ninth PAC compound may have a concentration of between about 0.03 wt % and about 1 wt %, and the tenth PAC compound may have a concentration of between about 0.03 wt % and about 1 wt %. However, any suitable concentrations may be utilized.

By utilizing the materials presented herein for the second PAC mixture, a lower overall concentration of the PACs may be utilized, thereby increasing the overall transmittance of the first passivation layer 301 by decreasing the amount of PACs that are present. By increasing the transmittance, subsequent imaging (described further below with respect to FIG. 4A) allows for greater cross-linking to occur deeper within the first passivation layer 301. Such a cross-linking allows for a better chemical resistance during development, thereby allowing via hole with more controlled angles to be achieved.

In an embodiment the polyimide solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the polyimide solvent for the polyimide composition include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monomethyl ether propionate, propylene glycol monoethyl ether propionate, propylene glycol methyl ether acetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

In an embodiment the polyimide resin and the PACs (e.g., the first PAC mixture and/or the second PAC mixture), along with any desired additives or other agents, are added to the polyimide solvent for application. For example, the polyimide resin may have a concentration of between about 15% and about 25%. Additionally, in an embodiment in which the first PAC mixture is utilized, the PACs collectively may have a concentration of between about 0.1% and about 15%-wt. In other embodiments, such as an embodiment in which the second PAC mixture is utilized, the PACs collectively may have a concentration of less than about 5%-wt. However, any suitable concentrations may be utilized.

Once added, the mixture is then mixed in order to achieve an even composition throughout the polyimide composition in order to ensure that there are no defects caused by an uneven mixing or non-constant composition. Once mixed together, the polyimide composition may either be stored prior to its usage or else used immediately.

Once ready, the first passivation layer 301 may be utilized by initially applying the polyimide composition onto the first redistribution layer 201. In an embodiment in which the polyimide composition is a varnish, the first passivation layer 301 may be applied to the first redistribution layer 201 so that the first passivation layer 301 coats an upper exposed surface of the first redistribution layer 201, and may be applied using a process such as a spin-on coating process, a dip coating method, an air-knife coating method, a curtain coating method, a wire-bar coating method, a gravure coating method, a lamination method, an extrusion coating method, combinations of these, or the like.

Once applied, the first passivation layer 301 may be baked in order to cure and dry the first passivation layer 301 prior to exposure (described further below). The curing and drying of the first passivation layer 301 removes the solvent components while leaving behind the resin, the PACs, and any other chosen additives. In an embodiment the pre-bake may be performed at a temperature suitable to evaporate the solvent, such as between about 40° C. and 150° C., such as about 150° C., although the precise temperature depends upon the materials chosen for the first passivation layer 301. The pre-bake is performed for a time sufficient to cure and dry the first passivation layer 301, such as between about 10 seconds to about 5 minutes, such as about 270 seconds.

Figure 4A:
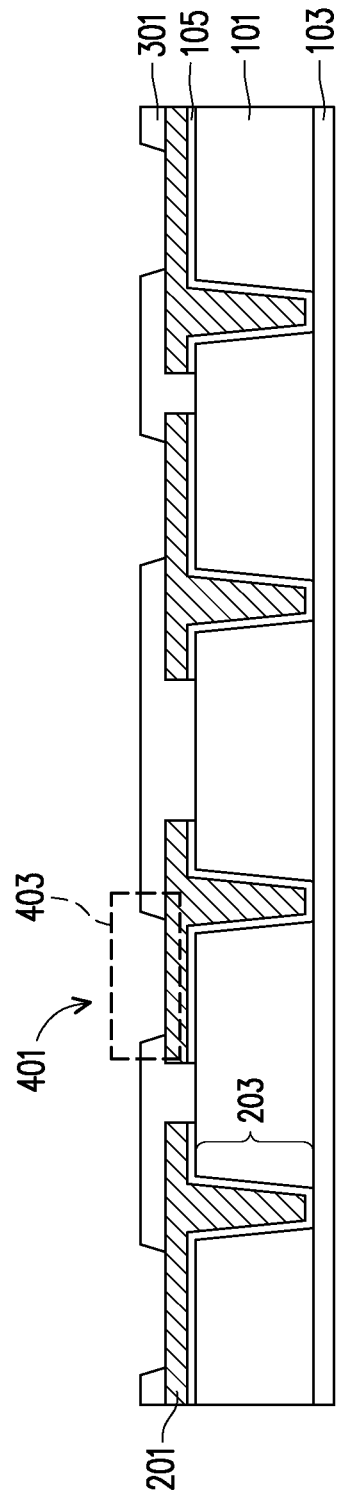
FIGS. 4A-4B illustrates a patterning of the first passivation layer, in accordance with some embodiments.

FIG. 4A illustrates that, once cured and dried, the first passivation layer 301 may be patterned in order to form first openings 401 (e.g., via openings) to the first redistribution layer 201. In an embodiment the patterning may be initiated by placing the first passivation layer 301 into an imaging device (not separately illustrated in FIG. 4A) for exposure. The imaging device may comprise a support plate, an energy source, and a patterned mask between the support plate and the energy source.

In an embodiment the energy source supplies energy such as light to the first passivation layer 301 in order to induce a reaction of the PACs, which in turn reacts with the resin to chemically alter those portions of the first passivation layer 301 to which the energy impinges. In an embodiment the energy may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy, such as mercury vapor lamps, xenon lamps, carbon arc lamps or the like, may also be utilized.

A patterned mask is located between the energy source and the first passivation layer 301 in order to block portions of the energy to form a patterned energy prior to the energy actually impinging upon the first passivation layer 301. In an embodiment the patterned mask may comprise a series of layers (e.g., substrate, absorbance layers, anti-reflective coating layers, shielding layers, etc.) to reflect, absorb, or otherwise block portions of the energy from reaching those portions of the first passivation layer 301 which are not desired to be illuminated. The desired pattern may be formed in the patterned mask by forming openings through the patterned mask in the desired shape of illumination.

In an embodiment the first passivation layer 301 is placed on a support plate. Once the pattern has been aligned to the first passivation layer 301, the energy source generates the desired energy (e.g., light) which passes through the patterned mask on its way to the first passivation layer 301. For example, in an embodiment in which the PACs comprise the first PAC mixture, the patterned energy may comprise light with a wavelength of between about 380 nm and about 440 nm (e.g., G/H-line) while, in an embodiment in which the PACs comprise the second PAC mixture, the patterned energy may comprise light with a wavelength of between about 200 nm and about 380 nm (e.g., I-line). However, any suitable wavelength of light may be utilized.

The patterned energy impinging upon portions of the first passivation layer 301 induces a reaction of the PACs within the first passivation layer 301. The chemical reaction products of the PACs' absorption of the patterned energy (e.g., acids/bases/free radicals) then react with the resin, chemically altering the first passivation layer 301 in those portions that were illuminated through the patterned mask. In some embodiments the chemical alteration includes a cross-linking between separate polymers of the polymer resin.

However, because of the increased transmittance caused by the first PAC mixture or the reduced concentration of the second PAC mixture (e.g., a transmittance of greater than about 0.5% to about 1%), more of the patterned energy will pass through the first passivation layer 301 during the exposure process. The patterned energy will then reach the underlying conductive material (e.g., copper) and scatter, and the scattered light then causes the PACs to regenerate even more free radicals, thereby causing an even greater degree of cross-linking adjacent to the underlying conductive material. As such, after the exposure process initiates the cross-linking a first region of the first passivation layer 301 has a higher degree of cross-linking than a second region of the first passivation layer 301, the first region being located between the second region and the carrier 101.

After the first passivation layer 301 has been exposed, a first post-exposure bake (PEB) may be used in order to assist in the generating, dispersing, and reacting of the acid/base/free radical generated from the impingement of the energy upon the PACs during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In an embodiment the temperature of the first passivation layer 301 may be increased to between about 70° C. and about 150° C. for a period of between about 40 seconds and about 120 seconds, such as about 2 minutes. However, any suitable temperature and time may be utilized.

Once the first passivation layer 301 has been exposed and baked, the first passivation layer 301 may be developed with the use of a developer. In an embodiment in which the first passivation layer 301 is the polyimide, the first developer may be an organic solvent or critical fluid may be utilized to remove those portions of the first passivation layer 301 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include cyclopentanon, hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

The first developer may be applied to the first passivation layer 301 using, e.g., a spin-on process. In this process the first developer is applied to the first passivation layer 301 from above the first passivation layer 301 while the first passivation layer 301 is rotated. In an embodiment the first developer may be at a temperature of between about 10° C. and about 80° C., such as about 50° C., and the development may continue for between about 1 minute to about 60 minutes, such as about 30 minutes.

However, while the spin-on method described herein is one suitable method for developing the first passivation layer 301 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

Once the first passivation layer 301 has been developed, the first passivation layer 301 may be rinsed. In an embodiment the first passivation layer 301 may be rinsed with a rinsing liquid such as propylene glycol monomethyl ether acetate (C260), although any suitable rinse solution, such as water, may be used.

After development a post development baking process may be utilized in order to help polymerize and stabilize the first passivation layer 301 after the development process. In an embodiment the post-developing baking process may be performed at a temperature of between about 80° C. and about 200° C., such as about 140° C. for a time of between about 60 sec and about 300 sec, such as about 2 minutes.

After the post-development baking, the first passivation layer 301 may be cured. In an embodiment in which the first passivation layer 301 comprises a polyimide, the curing process may be performed at a temperature of less than about 230° C., such as a temperature of between about 200° C. and 230° C., such as about 220° C. for a time of between about 1 hour and about 2 hours. However, any suitable temperature and time may be utilized.

Figure 4B:
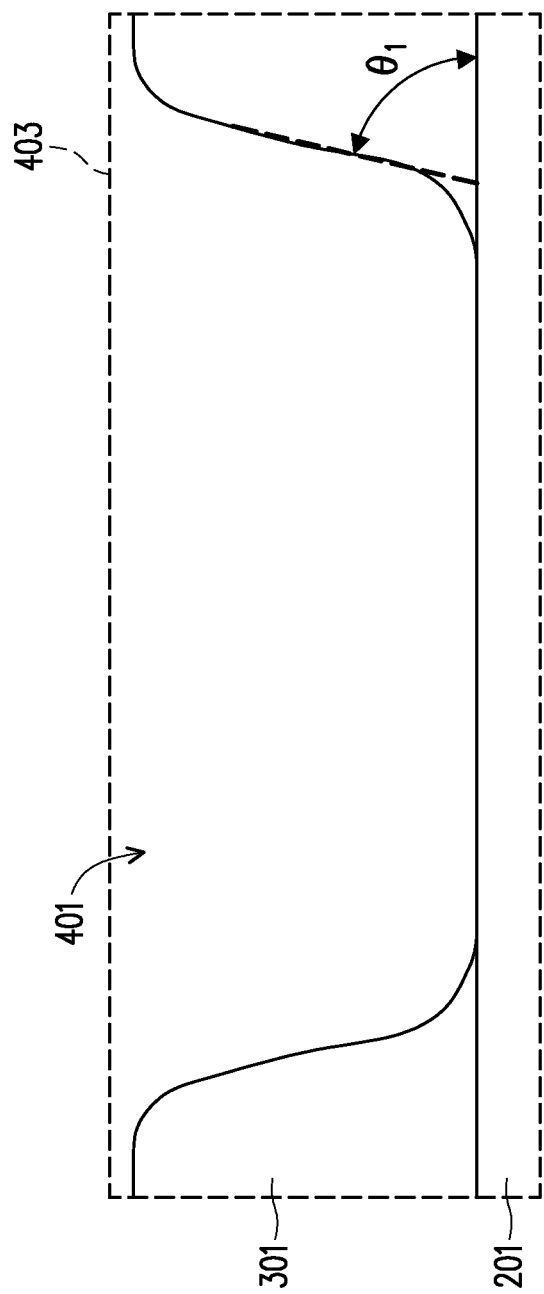

FIG. 4B illustrates a close up view of one of the first openings 401 surrounded by the dashed box 403 in FIG. 4A. By utilizing the first passivation layer 301 as described herein, the first openings 401 may be formed with a first angle $\theta_1$ (e.g., a taper angle) of between about 55° and about 78°, such as about 78°. For example, when the first PAC mixture is utilized, the first angle $\theta_1$ may be about 78°, while when the second PAC mixture is utilized, the first angle $\theta_1$ may be between about 55° and about 78°. However, any suitable angle may be utilized.

In a particular embodiment in which the second PAC mixture is utilized, the first opening 401 may have a width of about 45 µm. Additionally, the first passivation layer 301 may have a thickness of about 30 µm. With these dimensions, the taper of the first angle $\theta_1$ may be between about 55° and about 78° instead of tapered angles of greater than 78°, such as 100° (which would actually cause a concave surface to form).

In another particular embodiment in which the first PAC mixture is utilized, the first opening 401 may have a width of about 40 µm. Additionally, the first passivation layer 301 may have a thickness of about 28 µm. With these dimensions, the taper of the first angle $\theta_1$ may be about 78°. However, the dimensions for the first opening 401 are not limited to the dimensions described herein, as the first opening 401 may also have a width of 7 µm when the first passivation layer 301 is 5 µm or 5.5 µm thick, or the first opening 401 may be 21 µm wide when the first passivation layer 301 is 19 µm thick. Any suitable dimensions may be utilized.

Additionally, during the formation of the first passivation layer 301, the first passivation layer 301 will undergo some shrinkage. However, by utilizing the embodiments described herein, the shrinkage can be limited to be between about 1% and about 5%. As such, a thinner first passivation layer 301 may be applied while still ensuring adequate coverage and isolation. In some embodiments, the first passivation layer 301, after the formation, may have a thickness of between about 10 µm to about 60 µm.

Figure 5:
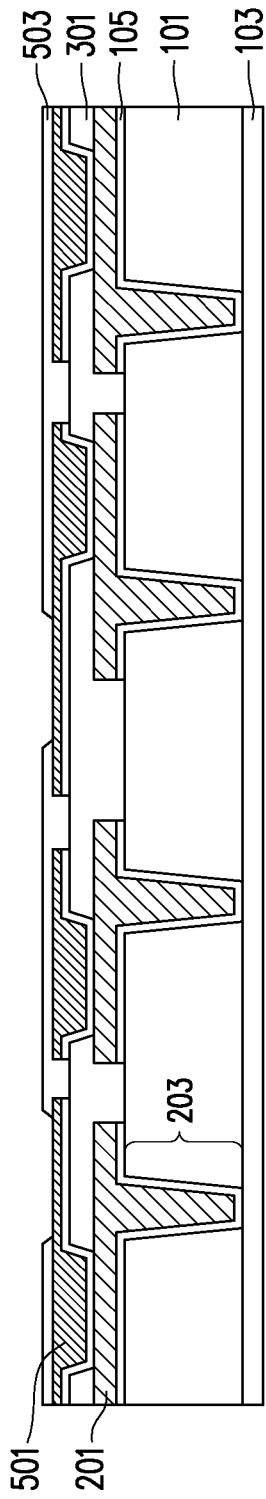
FIG. 5 illustrates formation of a second redistribution layer, in accordance with some embodiments.

FIG. 5 illustrates that, after the first passivation layer 301 has been patterned, a second redistribution layer 501 may be formed to extend through the openings formed within the first passivation layer 301, taking on the shape of the first openings 401, and make electrical connection with the first redistribution layer 201. In an embodiment the second redistribution layer 501 may be formed with a via portion and a line portion using materials and processes similar to the first redistribution layer 201. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

However, in an embodiment the second redistribution layer 501 may be formed to be thinner than the first redistribution layer 201. As such, the second redistribution layer 501 may be formed to a thickness of between about 5 µm and about 8 µm. However, any suitable thickness may be utilized.

After the second redistribution layer 501 has been formed, a second passivation layer 503 is applied, exposed, and developed over the second redistribution layer 501 in order to help isolate and protect the second redistribution layer 501. In an embodiment the second passivation layer 503 may be formed of similar materials and in a similar fashion as the first passivation layer 301. For example, the second passivation layer 503 may be formed of a polyimide that has been applied and patterned as described above with respect to the first passivation layer 301.

In another embodiment, however, the second passivation layer 503 may be formed using the second PAC mixture at a higher concentration than the first passivation layer 301. For example in this embodiment the second passivation layer 503 is formed using the same materials (e.g., polymer resin, solvent, PACs) as the first passivation layer 301, but the concentration of the second PAC mixture is increased to be about 15%-wt, which results in a transmittance of about 65% (using the I-line). As such, in this embodiment the thickness of the second passivation layer 503 may be reduced to be less than about 10 µm, such as being between about 5 µm and about 7 µm. However, any suitable thicknesses may be utilized.

Figure 6:
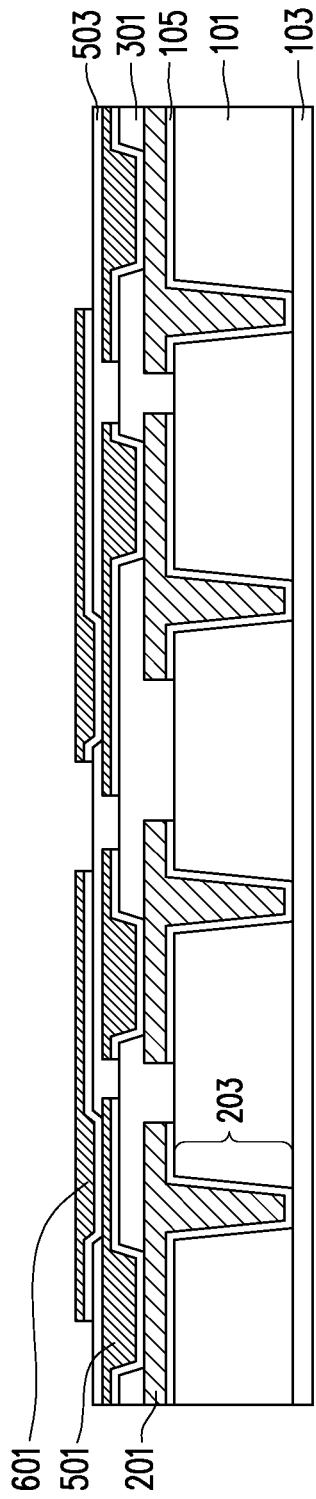
FIG. 6 illustrates formation of a third redistribution layer, in accordance with some embodiments.

FIG. 6 illustrates that, after the second passivation layer 503 has been patterned, a third redistribution layer 601 may be formed with vias extending through the openings formed within the second passivation layer 503 and make electrical connection with the second redistribution layer 501. In an embodiment the third redistribution layer 601 may be formed using materials and processes similar to the first redistribution layer 201. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

However, in embodiments in which the second passivation layer 503 is formed with an increased amount of the second PAC mixture (e.g., a second PAC mixture of about 15%-wt), the vias through the second passivation layer 503 may be formed with a height of about 7 µm and an aspect ratio of between about 0.8 and about 1.0, and with a taper angle of about 78°. As such, the via extending through the first passivation layer 301 has a difference in taper angle of between about 0° and about 20° from the via extending through the second passivation layer 503.

Additionally, in this embodiment the via extending through the second passivation layer 501 has a step coverage (e.g., a thickness ratio of the thinning thickness of a seed layer within the second passivation layer 503 to a thickness of the seed layer over the second passivation layer 503) of about 30%. However, the seed layer of the via extending through the first passivation layer 301 has a step coverage of greater than 30%.

Figure 7:
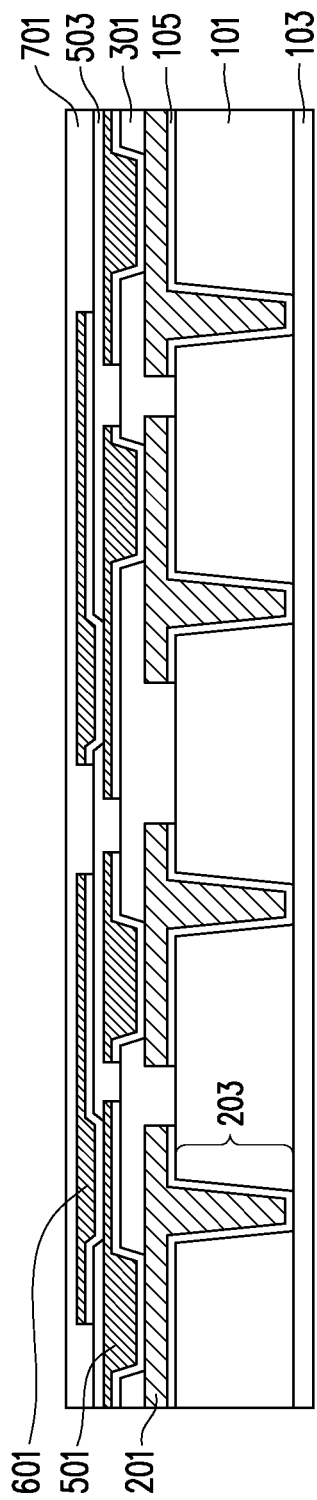
FIG. 7 illustrates formation of a third passivation structure, in accordance with some embodiments.

FIG. 7 illustrates that, after the third redistribution layer 601 has been formed, a third passivation layer 701 is applied, exposed, and developed over the third redistribution layer 601 in order to help isolate and protect the third redistribution layer 601. In an embodiment the third passivation layer 701 may be formed of similar materials and in a similar fashion as the second passivation layer 503. For example, the third passivation layer 701 may be formed of a polyimide that has been applied and patterned as described above with respect to the second passivation layer 503. However, any suitable material or process of manufacture may be utilized.

Figure 8:
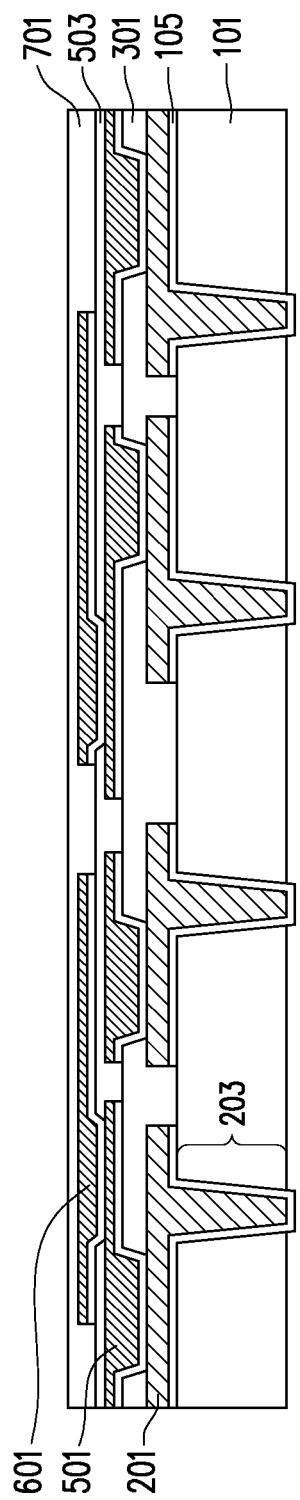
FIG. 8 illustrates a removal of a film tape, in accordance with some embodiments.

FIG. 8 illustrates a debonding of the carrier 101 from the film tape 103. In an embodiment in which the film tape 103 is an ultraviolet tape, an energy source such as an ultraviolet (UV) laser, a carbon dioxide ($CO_2$) laser, or an infrared (IR) laser, is utilized to irradiate and heat the film tape 103 until the film tape 103 loses at least some of its adhesive properties. Once performed, the carrier 101 and the film tape 103 may be physically separated.

Figure 9:
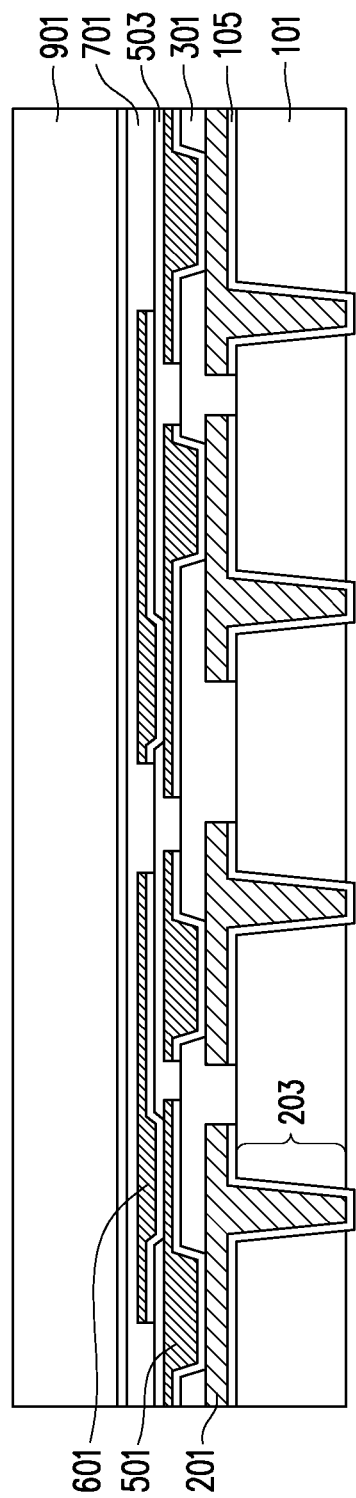
FIG. 9 illustrates an attachment of a carrier wafer, in accordance with some embodiments.

FIG. 9 illustrates that, once the film tape 103 has been removed, a carrier substrate 901 is attached to the third passivation layer 701. In an embodiment the carrier substrate 901 may be a glass wafer, a silicon wafer, a silicon germanium wafer, combinations of these, or the like, and may be bonded using a method such as fusion bonding, dielectric-to-dielectric bonding, combinations of these, or the like. In other embodiments the carrier substrate 901 may be attached using an adhesive layer, such as an ultraviolet tape a pressure sensitive tape, a radiation curable tape, combinations of these, or the like, may also be used. However, any suitable material and method of bonding may be utilized.

Figure 10:
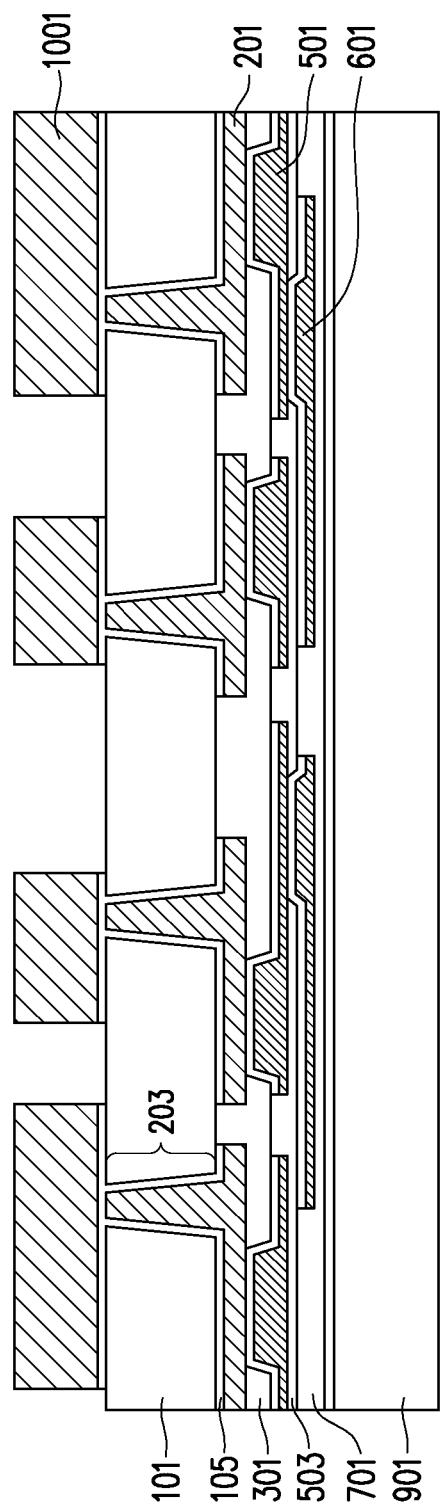
FIG. 10 illustrates formation of a fourth redistribution layer, in accordance with some embodiments.

FIG. 10 illustrates that, after the carrier wafer 901 has been bonded, the structure is flipped over and a fourth redistribution layer 1001 may be formed in contact with the now exposed through vias 203. In an embodiment the fourth redistribution layer 1001 may be formed using materials and processes similar to the first redistribution layer 201. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

Figure 11:
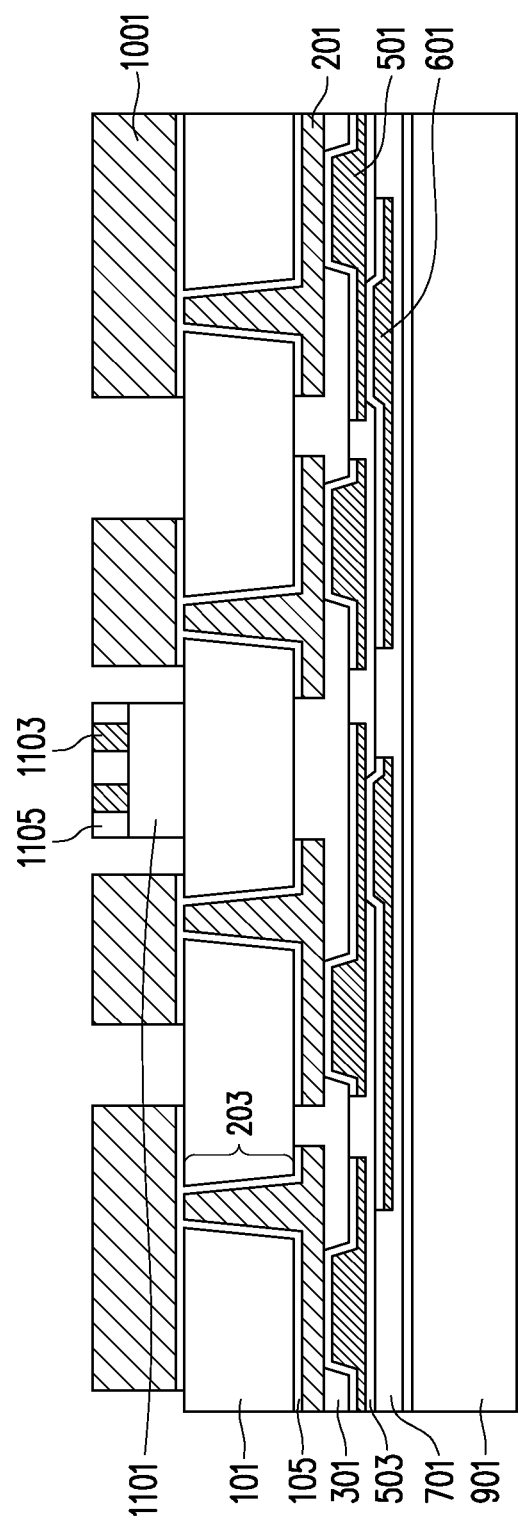
FIG. 11 illustrates placement of a first semiconductor device, in accordance with some embodiments.

FIG. 11 illustrates a placement of a first semiconductor die 1101 in between portions of the fourth redistribution layer 1001. In an embodiment the first semiconductor die 1101 may be designed and manufactured to provide a desired function to an overlying second semiconductor die 1403 (e.g., a sensor die—not illustrated in Figure ii but illustrated and described further below with respect to FIG. 14). For example, the first semiconductor die 1101 may be a digital signal processing die, an I/O die, a high voltage die (utilized to increase the sensitivity of the overlying sensor die), combinations of these, or the like. However, any suitable die may be utilized.

In an embodiment the first semiconductor die 1101 may comprise a semiconductor substrate (not separately illustrated), active devices (not separately illustrated), metallization layers (not separately illustrated) utilized to interconnect the active devices of the first semiconductor die 1101, and first external connections 1103 in order to interconnect the first semiconductor die 1101. The semiconductor substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices comprise a wide variety of active devices and passive devices such as capacitors, resistors, inductors and the like that may be used to generate the desired structural and functional requirements of the design for the first semiconductor die 1101. The active devices may be formed using any suitable methods either within or else on the semiconductor substrate.

The metallization layers are formed over the semiconductor substrate and the active devices of the first semiconductor die 1101 and are designed to connect the various active devices to form functional circuitry. In an embodiment the metallization layers are formed of alternating layers of dielectric and conductive material and may be formed through any suitable process (such as deposition, damascene, dual damascene, etc.). In an embodiment there may be four layers of metallization separated from the semiconductor substrate by at least one interlayer dielectric layer (ILD), but the precise number of metallization layers is dependent upon the design of the first semiconductor die 1101.

The first external connections 1103 may be formed to interconnect the first semiconductor die 1101 to other structures. As such, in some embodiments, the first external connections 1103 may be, for example, conductive pillars, such as copper pillars. However, any suitable connection, such as contact bumps, may be utilized.

A first protective layer 1105 may additionally be formed around the first external connections 1103. The first protective layer 1105 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first protective layer 1105 may be formed through a process such as chemical vapor deposition (CVD), although any suitable process may be utilized.

Figure 12:
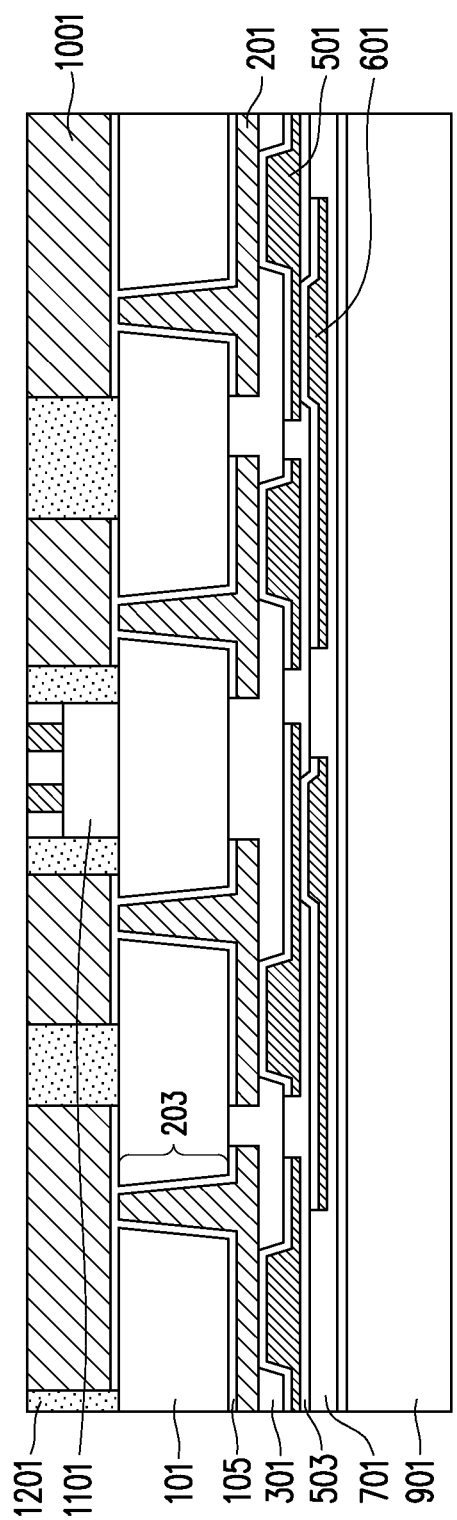
FIG. 12 illustrates placement of an encapsulant, in accordance with some embodiments.

FIG. 12 illustrates an encapsulation of the first semiconductor die 1101 and the fourth redistribution layer 1001 with an encapsulant 1201. The encapsulation may be performed in a molding device (not illustrated in FIG. 12), which may comprise a top molding portion and a bottom molding portion separable from the top molding portion. When the top molding portion is lowered to be adjacent to the bottom molding portion, a molding cavity may be formed for the structure comprising the first semiconductor die 1101 and the fourth redistribution layer 1001.

During the encapsulation process the top molding portion may be placed adjacent to the bottom molding portion, thereby enclosing the structure comprising the first semiconductor die 1101 and the fourth redistribution layer 1001 within the molding cavity. Once enclosed, the top molding portion and the bottom molding portion may form an airtight seal in order to control the influx and outflux of gasses from the molding cavity. Once sealed, the encapsulant 1201 may be placed within the molding cavity. The encapsulant 1201 may be a molding compound resin such as polyimide, PPS, PEEK, PES, a heat resistant crystal resin, combinations of these, or the like. The encapsulant 1201 may be placed within the molding cavity prior to the alignment of the top molding portion and the bottom molding portion, or else may be injected into the molding cavity through an injection port.

Once the encapsulant 1201 has been placed into the molding cavity such that the encapsulant 1201 encapsulates the structure comprising the first semiconductor die 1101 and the fourth redistribution layer 1001, the encapsulant 1201 may be cured in order to harden the encapsulant 1201 for optimum protection. While the exact curing process is dependent at least in part on the particular material chosen for the encapsulant 1201, in an embodiment in which molding compound is chosen as the encapsulant 1201, the curing could occur through a process such as heating the encapsulant 1201 to between about 100° C. and about 130° C., such as about 125° C. for about 60 sec to about 3000 sec, such as about 600 sec. Additionally, initiators and/or catalysts may be included within the encapsulant 1201 to better control the curing process.

However, as one having ordinary skill in the art will recognize, the curing process described above is merely an exemplary process and is not meant to limit the current embodiments. Other curing processes, such as irradiation or even allowing the encapsulant 1201 to harden at ambient temperature, may alternatively be used. Any suitable curing process may be used, and all such processes are fully intended to be included within the scope of the embodiments discussed herein.

FIG. 12 also illustrates a thinning of the encapsulant 1201 in order to expose the first semiconductor die 1101 and the fourth redistribution layer 1001 for further processing. The thinning may be performed, e.g., using a mechanical grinding or chemical mechanical polishing (CMP) process whereby chemical etchants and abrasives are utilized to react and grind away the encapsulant 1201, the first semiconductor die 1101 and the fourth redistribution layer 1001 until the first semiconductor die 1101 and the fourth redistribution layer 1001 have been exposed. As such, the structure comprising the first semiconductor die 1101 and the fourth redistribution layer 1001 may have a planar surface that is also planar with the encapsulant 1201.

However, while the CMP process described above is presented as one illustrative embodiment, it is not intended to be limiting to the embodiments. Any other suitable removal process may alternatively be used to thin the encapsulant 1201, the first semiconductor die 1101 and the fourth redistribution layer 1001. For example, a series of chemical etches may be utilized. This process and any other suitable process may be utilized to thin the encapsulant 1201, the first semiconductor die 1101 and the fourth redistribution layer 1001, and all such processes are fully intended to be included within the scope of the embodiments.

Figure 13:
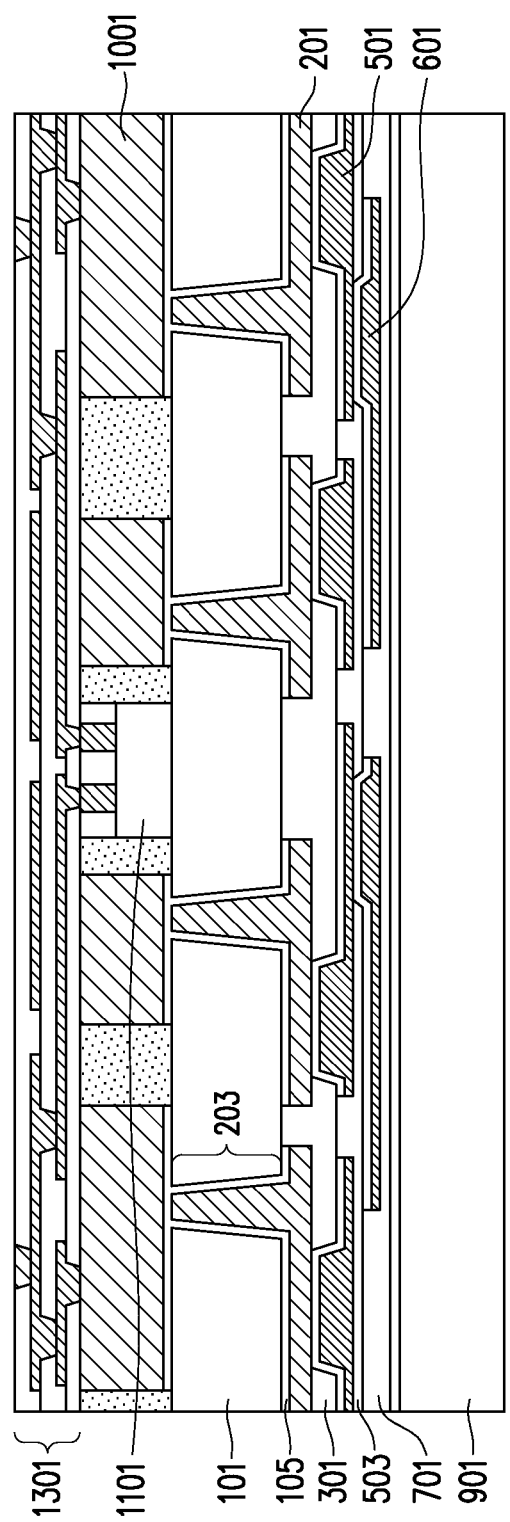
FIG. 13 illustrates formation of a first set of redistribution layers, in accordance with some embodiments.

FIG. 13 illustrates that, once the encapsulant 1201 has been placed, a first set of redistribution layers 1301 may be formed over the encapsulant 1201. In an embodiment the first set of redistribution layers 1301 comprise a plurality of conductive redistribution layers separated by a plurality of dielectric passivation layers (which are not individually labeled for clarity). Each of the plurality of dielectric passivation layers may be placed and patterned as described above with respect to the second passivation layer 503 and each of the plurality of conductive redistribution layers may be formed as described above with respect to the second redistribution layer 501. However, any suitable methods and materials may be utilized.

Figure 14:
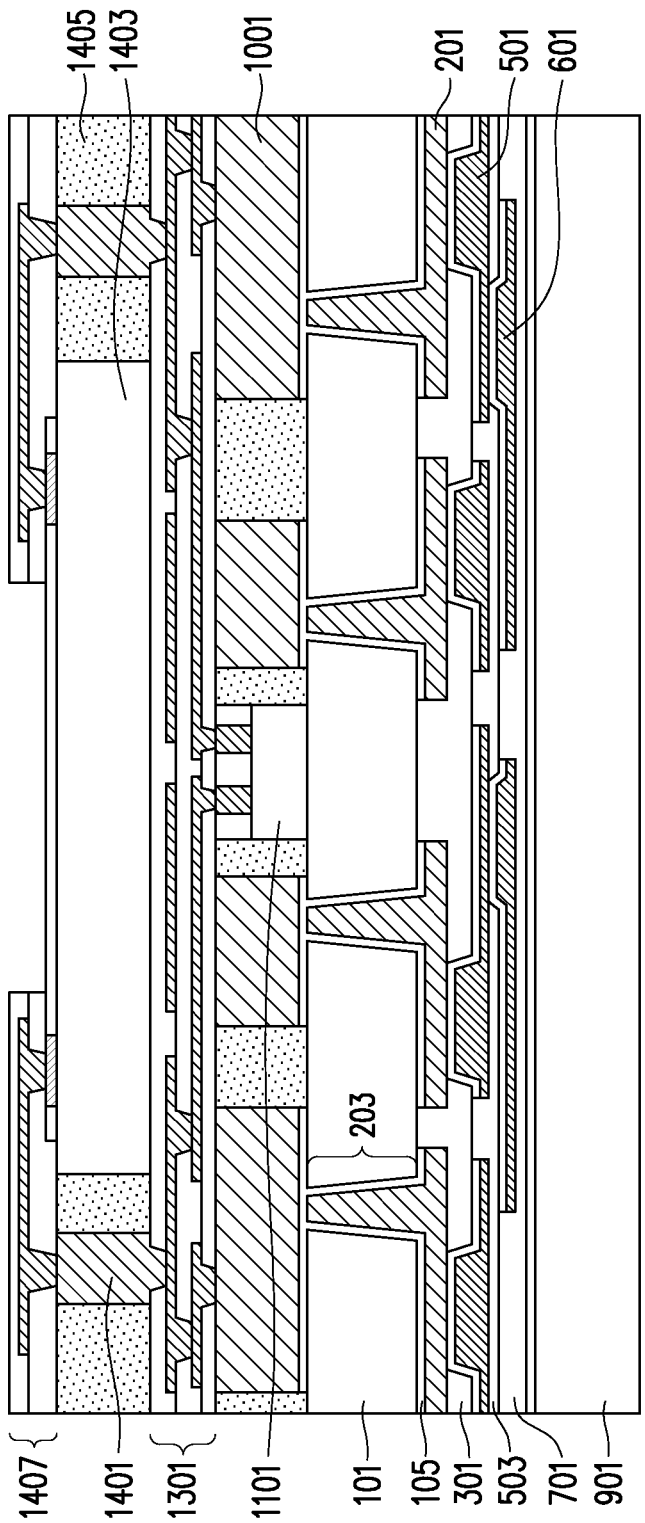
FIG. 14 illustrates placement of a second semiconductor device, in accordance with some embodiments.

In FIG. 14, through vias 1401 are formed extending away from the topmost dielectric layer of the first set of redistribution layers 1301. As an example to form the through vias 1401, a seed layer (not shown) is formed, for example, on the first set of redistribution layers 1301. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the layout of the through vias 1401. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 1401.

FIG. 14 also illustrated the placement of a second semiconductor die 1403 between the through vias 1401. The second semiconductor die 1403 may be a sensor die that is designed to work in conjunction with the first semiconductor die 1101. In some embodiments the sensor die may be a fingerprint sensor, an image sensor, a MEMs sensor, combinations of these, or the like, placed using, e.g., a pick and place process. However, any suitable process may be utilized.

In an embodiment the second semiconductor die 1403 comprises a second semiconductor substrate, sensing elements formed within or over the second semiconductor substrate, electrical routing, and contact pads. The second semiconductor substrate, the electric routing, and the contact pads may be similar to the structures discussed above with respect to the first semiconductor die 1101, and the sensing elements may be formed using any suitable methods and processes based on the type of sensor desired. However, any suitable structures and methods may be utilized.

Once the second semiconductor die 1403 has been placed, an encapsulant 1405 is formed on and around the various components. After formation, the encapsulant 1405 encapsulates the through vias 1401 and the second semiconductor die 1403. The encapsulant 1405 may be a molding compound, epoxy, or the like. The encapsulant 1405 may be applied by compression molding, transfer molding, or the like, and may be placed or formed such that the through vias 1401 and/or the second semiconductor die 1403 are buried or covered. The encapsulant 1405 may be applied in liquid or semi-liquid form and then subsequently cured.

After the encapsulant 1405 has been placed, a planarization process is performed on the encapsulant 1405 to expose the through vias 1401 and the second semiconductor die 1403. The planarization process may also remove material of the through vias 1401 until the through vias 1401 are exposed. Top surfaces of the through vias 1401 and the encapsulant 1405 are substantially coplanar after the planarization process within process variations. The planarization process may be, for example, a chemical-mechanical polish (CMP), a grinding process, or the like. In some embodiments, the planarization may be omitted, for example, if the through vias 1401 are already exposed.

Once the encapsulant 1405 has been planarized, a front-side redistribution structure 1407 is formed over the encapsulant 1405, the through vias 1401, and the integrated circuit dies 1403. The front-side redistribution structure 1407 includes dielectric layers and metallization pattern. The metallization patterns may also be referred to as redistribution layers or redistribution lines. The front-side redistribution structure 1407 is shown as an example having one metallization pattern. If more dielectric layers and metallization patterns are to be formed, steps and processes discussed below may be repeated.

In an embodiment, a first dielectric layer is deposited on the encapsulant 1405 and the through vias 1401. In some embodiments, the first dielectric layer is formed of a photo-sensitive material such as PBO, polyimide, BCB, or the like, which may be patterned using a lithography mask. The first dielectric layer may be formed by spin coating, lamination, CVD, the like, or a combination thereof. In some embodiments, a planarization process is performed to give the first dielectric layer a substantially planar upper surface.

Once in place, the first dielectric layer is then patterned. The patterning forms openings exposing portions of the through vias 1401, openings exposing portions of the contact pads, and openings exposing the sensing elements. The patterning may be by an acceptable process, such as by exposing and developing the first dielectric layer when the first dielectric layer is a photo-sensitive material or by etching using, for example, an anisotropic etch. In other embodiments, a mask layer (not specifically illustrated) may be formed and patterned over the first dielectric layer, and exposed portions of the first dielectric layer may be removed by, for example, etching.

Once the first dielectric layer is patterned, the metallization pattern is then formed. The metallization pattern includes conductive elements extending along the major surface of the first dielectric layer and extending through the first dielectric layer to physically and electrically couple to the through vias 1401 and the contact pads of the integrated circuit die 1403. As an example, to form the metallization pattern, a seed layer (not specifically illustrated) is formed over the first dielectric layer and in the openings extending through the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer (including portions of the seed layer within the openings over the through vias 1401 and the openings over the contact pads). A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern. The photoresist and portions of the seed layer (including portions of the photoresist and the seed layer within the openings over the sensing elements) on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Once the metallization pattern has been formed, a second dielectric layer is deposited on the metallization pattern and the first dielectric layer beneath the metallization pattern. The second dielectric layer may be formed in a manner similar to the first dielectric layer beneath the metallization pattern, and may be formed of a similar material as the first dielectric layer beneath the metallization pattern. In addition, the second dielectric layer may be patterned to form openings to expose the sensing elements. For example, the patterning may be by an acceptable process, such as by exposing and developing the second dielectric layer to light when the second dielectric layer is a photo-sensitive material or by etching using, for example, an anisotropic etch. The opening may have a different or substantially a same lateral width as the opening through the first dielectric layer beneath the metallization pattern and, in some embodiments, has a greater lateral width. Additional metallization patterns and dielectric layers, if any, may then be formed.

Figure 15:
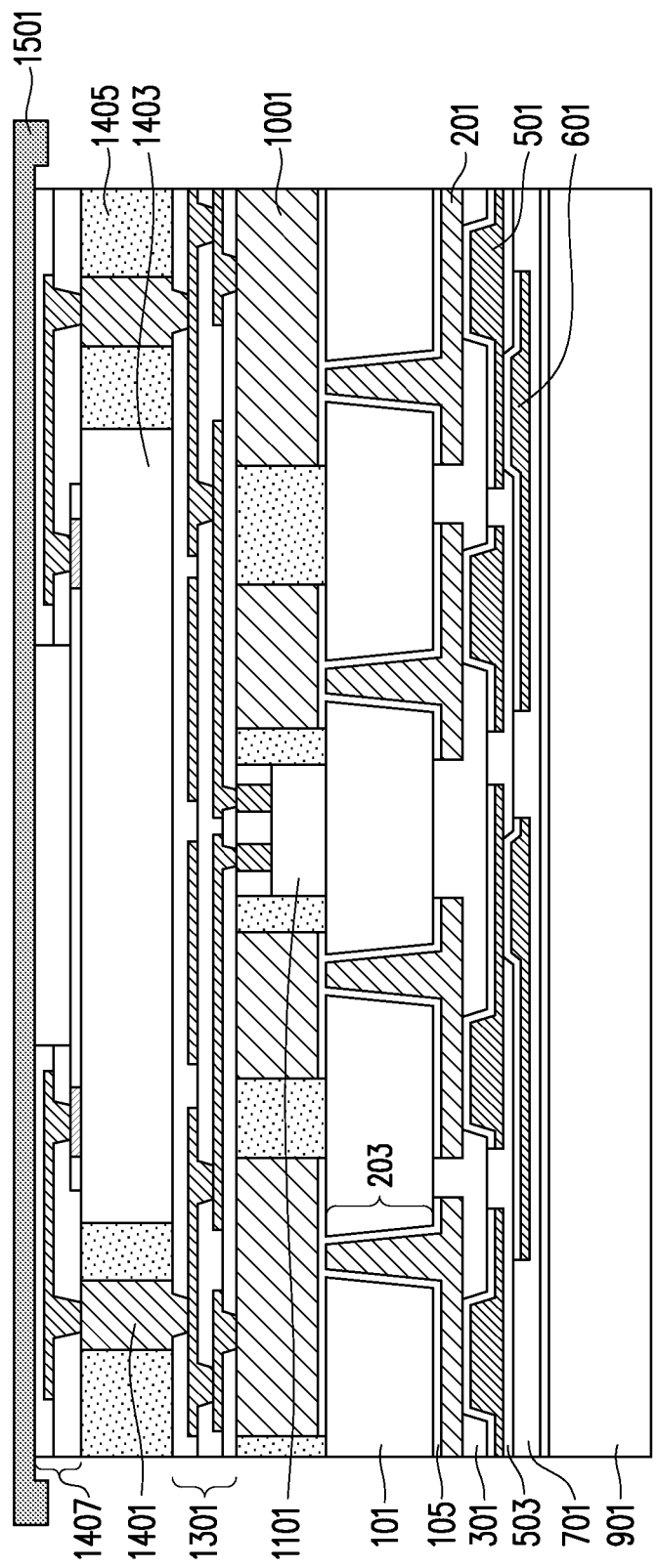
FIG. 15 illustrates attachment of a ring structure, in accordance with some embodiments.

FIG. 15 illustrates an attachment of the structure to a ring structure 1501. The ring structure 1501 may be a metal ring intended to provide support and stability for the structure during and after the debonding process. In an embodiment the front-side redistribution structure 1407 is attached to the ring structure using, e.g., a ultraviolet tape, although any other suitable adhesive or attachment may be used.

Figure 16:
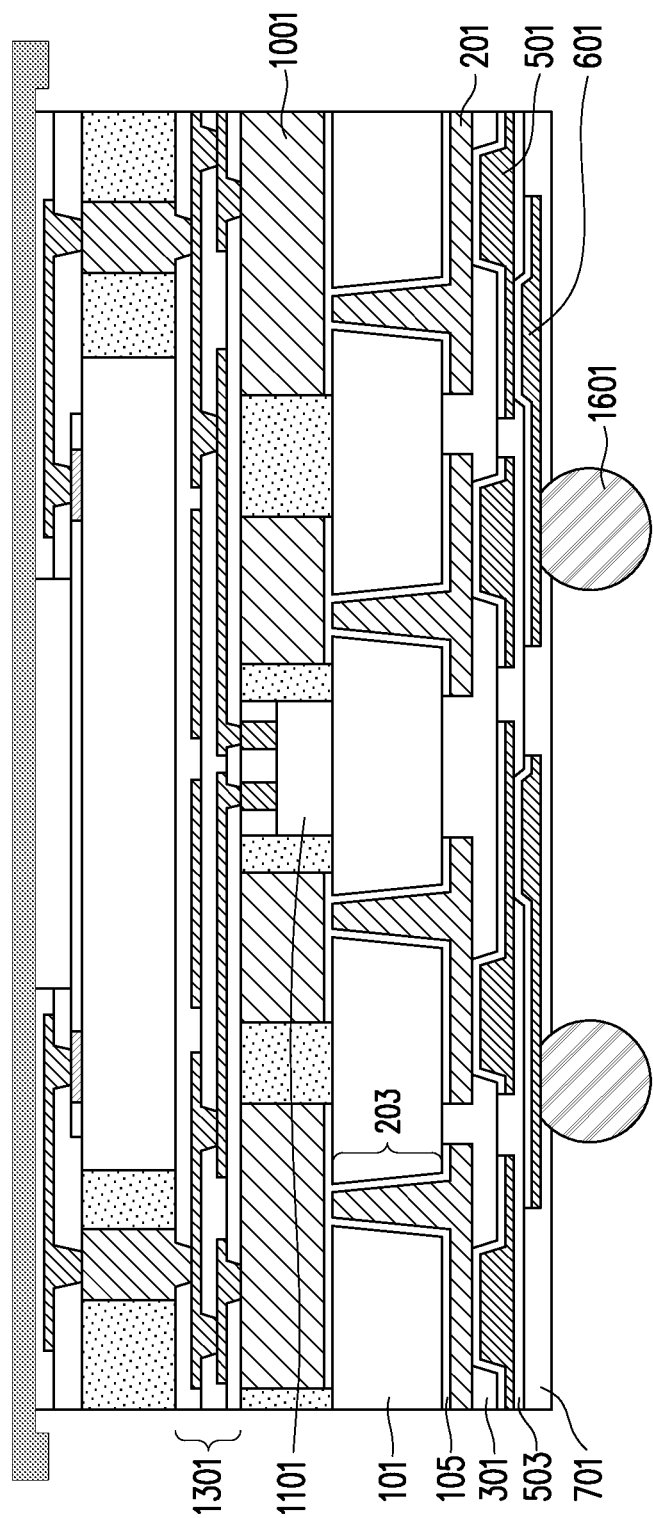
FIG. 16 illustrates formation of second external connections, in accordance with some embodiments.

FIG. 16 illustrates that, once the front-side redistribution structure 1407 is attached to the ring structure 1501, the carrier substrate 901 may be debonded using, e.g., a process to alter the adhesive properties of the adhesive layer (in an embodiment wherein the carrier substrate 901 is attached using an adhesive layer). In a particular embodiment in which the adhesive layer is an ultraviolet adhesive, an energy source such as an ultraviolet (UV) laser, a carbon dioxide ($CO_2$) laser, or an infrared (IR) laser, is utilized to irradiate and heat the adhesive layer until the adhesive layer loses at least some of its adhesive properties. Once performed, the carrier substrate 901 and the adhesive layer may be physically separated and removed from the third passivation layer 701.

FIG. 16 additionally illustrates a patterning of the third passivation layer 701 in order to expose the third redistribution layer 601. In an embodiment the third passivation layer 701 may be patterned using, e.g., a laser drilling method. In such a method a protective layer, such as a light-to-heat conversion (LTHC) layer or a hogomax layer (not separately illustrated in FIG. 16) is first deposited over the third passivation layer 701. Once protected, a laser is directed towards those portions of the third passivation layer 701 which are desired to be removed in order to expose the underlying third redistribution layer 601. During the laser drilling process the drill energy may be in a range from 0.1 mJ to about 30 mJ, and a drill angle of about 0 degree (perpendicular to the third passivation layer 701) to about 85 degrees to normal of the third passivation layer 701.

In another embodiment, the third passivation layer 701 may be patterned by initially applying a photoresist (not individually illustrated in FIG. 16) to the third passivation layer 701 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the third passivation layer 701 are removed with, e.g., a dry etch process. However, any other suitable method for patterning the third passivation layer 701 may be utilized.

Additionally, in embodiments in which the carrier substrate 901 is held in place with an adhesive layer, once the third passivation layer 701 has been patterned, a cleaning process may be performed in order to ensure that any remaining portions of the adhesive layer may be removed. In an embodiment the cleaning process may comprise suitable solvents, etchants, combinations of these, or the like, in order to clean and prepare the surfaces for additional manufacturing steps.

FIG. 16 additionally illustrates a placement of second external connections 1601 may be performed. In an embodiment the second external connections 1601 may be contact bumps such as microbumps or controlled collapse chip connection (C4) bumps and may comprise a material such as tin, or other suitable materials, such as silver or copper. In an embodiment in which the second external connections 1601 are contact bumps, the second external connections 1601 may comprise a material such as tin, or other suitable materials, such as silver, lead-free tin, or copper. In an embodiment in which the second external connections 1601 is a tin solder bump, the second external connections 1601 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape which may have a critical dimension of between about 60 μm and about 100 μm, and may be formed in either a round shape or an elliptical shape.

Once the second external connections 1601 have been placed, the package may be singulated. In an embodiment the singulation may be performed by using a saw blade (not shown) to slice through the structure, thereby separating one section from another. However, as one of ordinary skill in the art will recognize, utilizing a saw blade to singulate the structure is merely one illustrative embodiment and is not intended to be limiting. Other methods for singulating the structure, such as utilizing one or more etches to separate the structure, may also be utilized. These methods and any other suitable methods may be utilized to singulate the structure.

By modifying the transmittance of the material used to form the first passivation layer 301, a more controlled via shape may be achieved. In particular, by achieving a higher transmittance, more energy will be scattered during the imaging process, causing a greater cross-linking within lower regions of the material. Such cross-linking leads to a more controlled shape than otherwise achievable.

Figure 17:
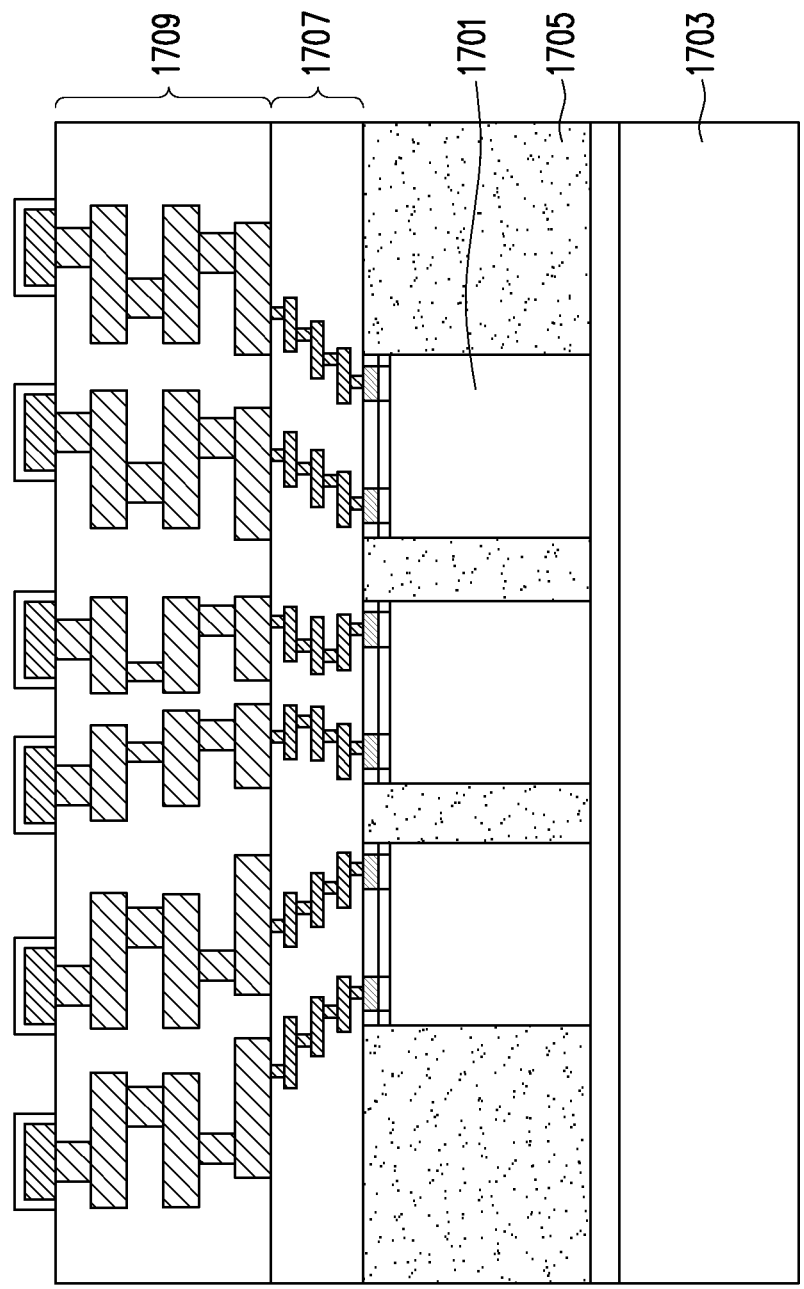
FIG. 17 illustrates a system on wafer, in accordance with some embodiments.

FIG. 17 illustrates that the embodiments described herein may be applied in other embodiments, such as embodiments which include a system-on-wafer (SOW) embodiment. In these embodiments one or more system-on-chips (SoC) 1701 are located on a carrier 1703 and embedded within an encapsulant 1705. A first series of metallization layers 1707 (with redistribution layers and passivation layers formed as described herein) and a second series of metallization layers 1709 (with redistribution layers and passivation layers formed as described herein) are formed over the encapsulant 1705. However any suitable structures may be utilized.

Figure 18:
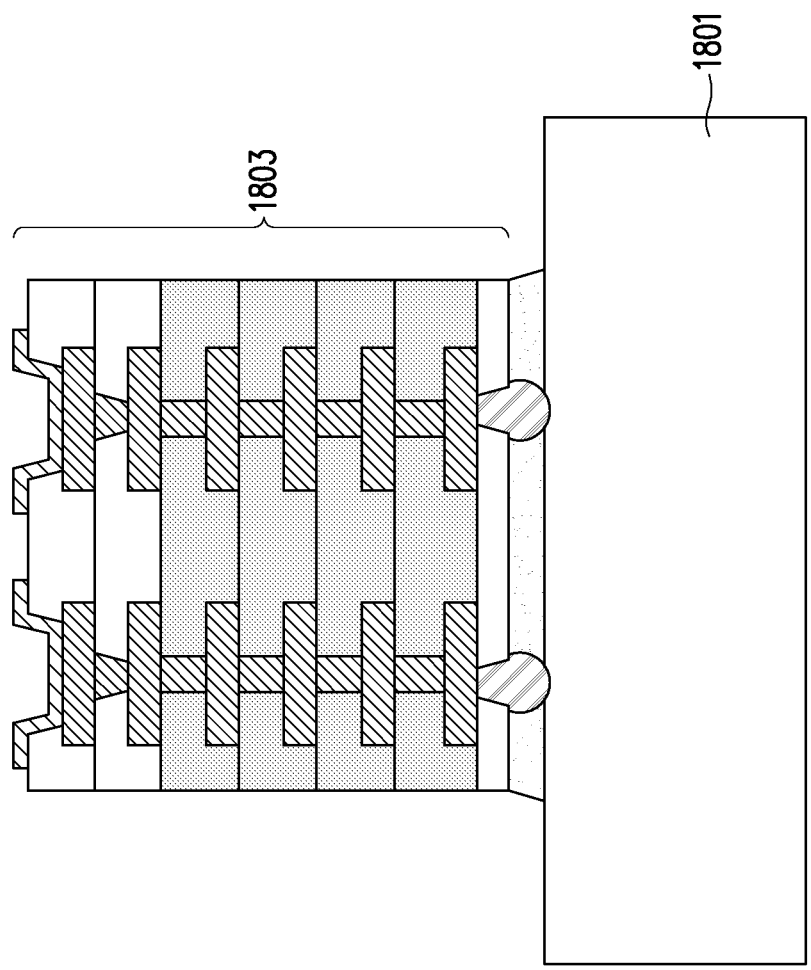
FIG. 18 illustrates a system on integrated substrate, in accordance with some embodiments.

FIG. 18 also illustrates that the embodiments described herein may be applied in other embodiments, such as embodiments which include systems on integrated substrate (SOIs). In these embodiments an integrated substrate 1801 is utilized, and a redistribution structure 1803 with a plurality of redistribution layers, vias, and dielectric layers (each formed using one or more of the methods described herein) is attached to the integrated substrate 1801 using, e.g., solder balls and an underfill. However, any suitable structures may be utilized.

In an embodiment, a method of manufacturing a semiconductor device, the method includes: forming a redistribution layer over a substrate; applying a first dielectric material to the redistribution layer and the substrate, wherein the first dielectric material has a transmittance to a first energy of greater than about 0.5%; and imaging the first dielectric material with the first energy. In an embodiment, the first dielectric material has a thickness of between about 20 μm and about 60 μm. In an embodiment, the redistribution layer has a thickness of greater than or equal to about m. In an embodiment, the first dielectric material has a concentration of photoactive components of less than 15%-wt. In an embodiment, the method further includes developing the first dielectric material, wherein after the developing the first dielectric material a first opening has a taper angle of between about 55° and about 78°. In an embodiment, the first dielectric material has a concentration of photoactive components of less than 5%-wt. In an embodiment, the method further includes developing the first dielectric material, wherein after the developing the first dielectric material a first opening has a taper angle of about 78°.

In an embodiment, a method of manufacturing a semiconductor device, the method includes: applying a dielectric coating onto a carrier substrate; initiating cross-linking within the dielectric coating by exposing the dielectric coating to a patterned energy source, wherein after the initiating the cross-linking a first region of the dielectric coating has a higher degree of cross-linking than a second region of the dielectric coating, the first region being located between the second region and the carrier substrate; developing the dielectric coating to form a via hole; and forming a conductive via in the via hole. In an embodiment, the via hole has a taper angle of between about 55° and about 78°. In an embodiment, the taper angle is about 78°. In an embodiment, the dielectric coating has a photoactive component concentration of less than about 15 wt %. In an embodiment, the dielectric coating has a photoactive component concentration of less than about 5 wt %. In an embodiment, the photoactive component comprises an amine group and a phosphine group. In an embodiment, the photoactive component comprises a chemical with a first carbon ring and a second carbon ring, the first carbon ring being saturated, the second carbon ring being unsaturated.

In an embodiment, a semiconductor device includes: a first dielectric layer; a first via extending through the first dielectric layer, the via having a tapered sidewall angle of between about 55° and about 78°; a second via extending through a carrier substrate, the second via being electrically connected to the first via; and a first semiconductor die located over an opposite side of the carrier substrate from the first via, the first semiconductor die electrically connected to the second via. In an embodiment, the tapered sidewall angle is about 78°. In an embodiment, the first dielectric material has a thickness of between about 20 μm and about 60 μm. In an embodiment, the semiconductor device further includes a redistribution layer located between the first dielectric layer and the first via, the redistribution layer having a thickness of greater than or equal to about 20 μm. In an embodiment, the semiconductor device further includes a second dielectric layer adjacent to the first dielectric layer, wherein the second dielectric layer has a thickness of between about 5 μm and about 7 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first via extending through a first dielectric layer, the first via having a tapered sidewall angle of between 55° and 78°, the first via being electrically connected to a second via, the second via extending through a carrier substrate, wherein the tapered sidewall angle is measured at a smallest width of the first via;
   placing a first semiconductor die located over an opposite side of the carrier substrate from the first via; and
   electrically connecting the first semiconductor die to the second via with a redistribution layer, wherein after the electrically connecting the redistribution layer is located between the first dielectric layer and the first via, the redistribution layer having a thickness of greater than or equal to 20 µm.

2. The method of claim 1, wherein the tapered sidewall angle is 78°.

3. The method of claim 1, wherein the first dielectric layer has a thickness of between 20 µm and 60 µm.

4. The method of claim 3, wherein the forming the first via further forms a redistribution layer, the redistribution layer having a thickness of greater than or equal to 20 µm.

5. The method of claim 1, further comprising forming a second dielectric layer adjacent to the first dielectric layer, wherein the second dielectric layer has a thickness of between 5 µm and 7 µm.

6. The method of claim 5, further comprising forming a second redistribution layer adjacent to the second dielectric layer, the second redistribution layer having a thickness of between 5 µm and 8 µm.

7. The method of claim 1, wherein the first dielectric layer has a concentration of photoactive components of less than 5%-wt.

8. A method of manufacturing a semiconductor device, the method comprising:
   applying a dielectric coating onto a carrier substrate, wherein the dielectric coating comprises a photoactive component;
   initiating cross-linking within the dielectric coating by exposing the dielectric coating to a patterned energy source, wherein after the initiating the cross-linking a first region of the dielectric coating has a higher degree of cross-linking than a second region of the dielectric coating, the first region being located between the second region and the carrier substrate, wherein the photoactive component comprises an amine group and a phosphine group;
   developing the dielectric coating to form a via hole; and
   forming a conductive via in the via hole.

9. The method of claim 8, wherein the via hole has a taper angle of between 55° and 78°.

10. The method of claim 9, wherein the taper angle is 78°.

11. The method of claim 8, wherein the dielectric coating has a photoactive component concentration of less than 15 wt %.

12. The method of claim 11, wherein the dielectric coating has a photoactive component concentration of less than 5 wt %.

13. The method of claim 8, wherein the photoactive component comprises a chemical with a first carbon ring and a second carbon ring, the first carbon ring being saturated, the second carbon ring being unsaturated.

14. A method of manufacturing a semiconductor device, the method comprising:
   forming a first dielectric layer;
   forming a first via extending through the first dielectric layer, the first via having a tapered sidewall angle of between 55° and 78°, wherein the first via is electrically connected to a second via, the second via extending through a carrier substrate; and
   placing a first semiconductor die located over an opposite side of the carrier substrate from the first via, the first semiconductor die electrically connected to the second via; and
   forming a redistribution layer, wherein after the placing the first semiconductor die the redistribution layer is located between the first dielectric layer and the first via, the redistribution layer having a thickness of greater than or equal to 20 µm.

15. The method of claim 14, wherein the tapered sidewall angle is 78°.

16. The method of claim 14, wherein the first dielectric layer has a thickness of between 20 µm and 60 µm.

17. The method of claim 14, further comprising forming a second dielectric layer adjacent to the first dielectric layer, wherein the second dielectric layer has a thickness of between 5 µm and 7 µm.

18. The method of claim 17, further comprising, prior to the forming the second dielectric layer, forming a second redistribution layer located over the first dielectric layer, the second redistribution layer having a thickness of between 5 µm and 8 µm.

19. The method of claim 14, wherein the first dielectric layer comprises a polyimide.

20. The method of claim 14, wherein the first dielectric layer comprises a photoactive component, and wherein the photoactive component comprises an amine group and a phosphine group.

* * * * *